United States Patent
Johansson et al.

(10) Patent No.: US 11,407,938 B2
(45) Date of Patent: Aug. 9, 2022

(54) STRUCTURE, AGGLOMERATE, CONVERSION ELEMENT AND METHOD OF PRODUCING A STRUCTURE

(71) Applicant: OSRAM Opto Semiconductors GmbH, Regensburg (DE)

(72) Inventors: Erik Johansson, Portland, OR (US); Joseph A. Treadway, Portland, OR (US); Juanita N. Kurtin, Hillsboro, OR (US)

(73) Assignee: OSRAM Opto Semiconductors GmbH, Regensburg (DE)

(*) Notice: Subject to any disclaimer, the term of this patent is extended or adjusted under 35 U.S.C. 154(b) by 62 days.

(21) Appl. No.: 16/777,921

(22) Filed: Jan. 31, 2020

(65) Prior Publication Data

US 2021/0238476 A1 Aug. 5, 2021

(51) Int. Cl.
*C09K 11/02* (2006.01)
*B82Y 20/00* (2011.01)
*H01L 33/50* (2010.01)

(52) U.S. Cl.
CPC ............ *C09K 11/025* (2013.01); *B82Y 20/00* (2013.01); *H01L 33/502* (2013.01)

(58) Field of Classification Search
CPC ...... C09K 11/025; B82Y 20/00; H01L 33/502
See application file for complete search history.

(56) References Cited

U.S. PATENT DOCUMENTS

| | | | | |
|---|---|---|---|---|
| 8,410,470 B2* | 4/2013 | Omata | ................ | C09K 11/54 257/17 |
| 9,196,785 B2* | 11/2015 | Lee | ................ | H01L 33/502 |
| 9,567,514 B2* | 2/2017 | Zhao | ................ | C09K 11/883 |
| 9,780,266 B2* | 10/2017 | Lotito | ................ | H01L 33/60 |
| 2012/0252140 A1 | 10/2012 | Aimiya et al. | | |
| 2016/0137916 A1 | 5/2016 | Wachi | | |
| 2019/0189863 A1* | 6/2019 | Choi | ................ | H01L 33/50 |
| 2021/0126167 A1* | 4/2021 | Zhong | ................ | H01L 33/502 |

OTHER PUBLICATIONS

Crépeau, G. et al.; "Nature, Structure and Strenght of the Acidic Sites of Amorphous Silica Aluminia: An IR and NMR Study"; Jul. 15, 2006; p. 15172-15185; American Chemical Society.
Pozarnsky, G.A. et al.; "Multinuclear NMR study of aluminosilicate sol-gel synthesis using the prehydrolysis method"; Oct. 2, 1995; pp. 212-225, vol. 190, Issue 3; Journal of Non-Crystalline Solids.
Yang, Joong-Sik et al.; "Preparation of lithium aluminosilicate glassceramic monolith from metal-alkoxide solution"; Mar. 1990; pp. 1773-1778, vol. 25, Issue 3; Journal of Materials Science.
International Search Report issued for the corresponding PCT patent application No. PCT/EP2021/051783, dated May 3, 2021, 12 pages (for informational purposes only).
Koole, Rolf et al., "On the Incorporation Mechanism of Hydrophobic Quantum Dots in Silica Spheres by a Reverse Microemulsion Method", Chemistry of Materials, Apr. 2008, pp. 2503-2512, vol. 20, Issue 7.
Ziegler, Jan et al., "Silica-Coated InP/ZnS Nanocrystals as Converter Material in White LEDs", Advanced Materials, Nov. 2008, pp. 4068-4073, vol. 20, Issue 21.

* cited by examiner

*Primary Examiner* — C Melissa Koslow
(74) *Attorney, Agent, or Firm* — Viering, Jentschura & Partner MBB

(57) ABSTRACT

A structure may include a quantum structure and a barrier layer that may coat the quantum structure. The barrier layer may include aluminum and at least one material that is X1, X2, Si, O, or combinations thereof where X1 and X2 are monovalent positively charged elements and/or divalent positively charged elements. In addition, an agglomerate, a conversion element, and a method of producing a structure are disclosed.

8 Claims, 3 Drawing Sheets

STRUCTURE, AGGLOMERATE, CONVERSION ELEMENT AND METHOD OF PRODUCING A STRUCTURE

TECHNICAL FIELD

The invention relates to a structure, an agglomerate and a conversion element. Further the invention relates to a method of producing a structure.

BACKGROUND

An object to be achieved is to have a structure with a good quantum yield and high stability. It is a further object to be achieved to provide an agglomerate with a high stability and good quantum yield. Yet another object to be achieved is to provide a conversion element with at least one structure or with at least one agglomerate which results in a good quantum yield. A further object to be achieved is to provide a method for producing a structure with a good quantum yield.

SUMMARY

A structure may include a quantum dot, a quantum structure, a quantum well, a phosphor, a conversion material, a semiconductor nanoparticle, or a combination thereof. The structure may be or include a narrow band emitter with broad absorption and emission spectra in the wavelength range from UV up to IR, depending on its material composition and size. In a non-limiting embodiment, the structure may be configured to be a conversion material for converting the wavelength of a primary radiation that passes through at least portion of the conversion material.

The structure may be used in many important applications including biological labelling, quantum dot lasers, solar cells, and as down-converters in light-emitting diodes. Down-converting means that a primary radiation of a first wavelength range is converted into secondary radiation of a second wavelength range that comprises longer wavelengths than the primary radiation. In general, the structure absorbs primary radiation, converts the absorbed radiation at least partially, or completely, into secondary radiation of a second wavelength range and reemits the converted radiation.

According to one non-limiting embodiment, the structure may include a quantum structure, such as a quantum dot, a quantum well, a semiconductor nanoparticle, a non-quantum confined nanoparticle, or combinations thereof. The quantum structure absorbs primary radiation of a pre-determined first wavelength and emits secondary radiation of a particular second wavelength. In a non-limiting embodiment, the quantum structure may include a nanocrystalline shell and a nanocrystalline core, or a plurality thereof. The material of the nanocrystalline shell and the material of the nanocrystalline core may be different from each other. The materials of the nanocrystalline core and nanocrystalline shell may be or include, but are not limited to, an II-VI-compound semiconductor material, I-III-VI-compound semiconductor material, III-V-compound semiconductor material, or a combination thereof. As non-limiting examples, the nanocrystalline core may be cadmium selenide and the nanocrystalline shell is cadmium sulfide, the nanocrystalline core is cadmium sulfide and the nanocrystalline shell is zinc sulphide, or combinations thereof.

The nanocrystalline shell may coat the nanocrystalline core. For example, the quantum structure may have a high photoluminescent quantum yield (PLQY) and may be a down-converting material. The resulting geometries of the quantum structure may include non-spherical quantum structure, rod-shaped quantum structure, spherical quantum structure, or combinations thereof. Further, the nanocrystalline shell of the quantum structure may be dumbbell-shaped.

According to one non-limiting embodiment, the structure may include a barrier layer. The barrier layer can be spherical, non-spherical, rod-shaped, dumbbell-shaped, or combinations thereof. For example, the barrier layer may be in contact with air, nitrogen, argon, a matrix material, or combinations thereof. Further, the barrier layer may serve for mechanical and/or chemical protection of the quantum structure. The barrier layer may protect the quantum structure and is—as far as possible—impermeable to water, oxygen, acids, environmental influences, and combinations thereof. Further, the material of the barrier layer may have a high density and is permeable to electromagnetic radiation. The barrier layer may be applied by an atomic layer deposition (ALD) method in a non-limiting embodiment.

According to another non-limiting embodiment, the barrier layer may coat the quantum structure. The barrier layer may be in contact, for example in direct physical contact, with the shell of the quantum structure. The quantum structure can be off-centered or centered in the barrier layer. Further, the barrier layer may protect the quantum structure against moisture, oxygen, air, other environmental effects, or combinations thereof to extend the lifetime of the quantum structure.

According to another non-limiting embodiment, the barrier layer may include aluminum (Al) and at least one material that may be or include, but is not limited to, X1, X2, Si, O, or combinations thereof. X1 and X2 may be or include, but are not limited to, monovalent and/or divalent positively charged elements. In a non-limiting example, X1 and X2 may be cations, such as but not limited to, an alkali metal, an alkaline earth metal, a transition metal, an actinide a lanthanide, or combinations thereof. For example, X1 or X2 may be or include zinc, lithium, potassium, sodium, or combinations thereof.

More than one barrier layer may be formed around the quantum structure; multiple barrier layers may be the same or different. For example, the barrier layers may have the same or different thickness, or such layers may have the same or different materials. Different barrier layers may further be differentiated from each other by not being chemically connected to each other and/or by having grain boundaries between them. Thus, a quantum structure with a plurality of barrier layers can be formed where the plurality of barrier layers are not connected to each other via a covalent bond. A homogenous, graded or multi-domain structure may be formed having a stable light emission and high photoluminescent quantum yield (PLQY) can be obtained.

According to another non-limiting embodiment, a structure may include a quantum structure and a barrier layer where the barrier layer coats the quantum structure. The barrier layer may include Al and at least one material, such as but not limited to, X1, X2, Si, O, or combinations thereof. X1 and X2 may be or include, but is not limited to, monovalent positively charged elements and/or divalent positively charged elements.

According to another non-limiting embodiment, the structure may include a ratio of Al:Si in the barrier layer where the ratio ranges from 1:1 to 1:4. The Al:Si ratio can be used to tune the hydrophobicity and acidity of the barrier layer, which allows control over water transport through the barrier layer and also over the local dielectric properties of the material. This also leads to better strain engineering and corrosion control.

According to another non-limiting embodiment, the structure includes a ratio of X1: Si and/or X2:Si in the barrier layer where the ratio ranges from 1:1 to 1:17, such as from 1:1 to 1:4 in an alternative embodiment. This ratio leads to a particularly stable barrier layer.

According to another non-limiting embodiment, X1 or X2 is lithium. For example, X1 is lithium and X2 is potassium or vice versa. With these alkali metals, an improved chemical and mechanical stability of the barrier layer may be achieved. In comparison to silica-only encapsulations of the quantum dots, the barrier layer leads to improved stabilisation of the quantum structures.

According to another non-limiting embodiment, the barrier layer of the structure comprises or consists of aluminum oxide. For example, the barrier layer may consist of aluminum oxide barrier layer that is applied by an atomic layer deposition (ALD) method. Aluminum oxide may have better barrier layer performance. This means that the aluminum oxide barrier layer is very compact and therefore impermeable to harmful environmental influences. Thus, the protection of the quantum structure is improved. Further, the aluminum oxide barrier layer has a high permeability for electromagnetic radiation.

In another non-limiting embodiment, one barrier layer may be or include aluminum oxide and one or more additional barrier layers include X1, X2, Al, Si, O, or combinations thereof. For example, the quantum structure may be coated by an aluminum oxide barrier layer, and then the aluminum oxide barrier layer may be coated by one or more additional barrier layers that include the X1, X2, Al, Si, O, or combinations thereof.

According to another non-limiting embodiment, a thickness of the barrier layer may range from 10 nanometers to 1000 nanometers. Alternatively, the barrier layer may have a thickness ranging from 10 nanometers to 100 nanometers.

According to another non-limiting embodiment, the barrier layer of the structure may completely cover the quantum structure. The barrier layer may be directly bonded to the quantum structure. Each quantum structure may be individually coated by the barrier layer. For example, the barrier layer may have a shell that completely encloses the quantum structure and abuts a material of the quantum structure on a side facing towards the quantum structure. For example, the barrier layer may have a constant thickness.

According to another non-limiting embodiment, the structure may include one or more further barrier layers where the further barrier layer(s) coats the quantum structure, at least partially or completely. The geometry of the further barrier layer(s) can be spherical, rod-shaped, non-spherical, dumbbell-shaped, or combinations thereof. In addition, the quantum structure can be off-centered or centered in the further barrier layer(s). The further barrier layer leads to improved protection of the structure against environmental influences.

According to another non-limiting embodiment, the further barrier layer(s) covers a first barrier layer. The further barrier layer is in direct physical contact with the first barrier layer.

According to another non-limiting embodiment, the further barrier layer(s) may include at least one material, such as but not limited to, silica, titanium oxide, zirconia, aluminum oxide, hafnia, and alkali and alkaline earth metal cations. Each further barrier layer can comprise a different material selected from the mentioned group.

In a non-limiting example, the quantum structure can be surrounded by graded barrier layers. The graded barrier layers may include a phase-pure barrier layer and a mixed barrier layer. The phase-pure barrier layer may surround the quantum structure, and the phase-pure barrier layer may surround the mixed barrier layer. The mixed barrier layer may include combination of the materials of the further barrier layers; whereas, the phase-pure barrier layer is a pure barrier layer and/or a further barrier layer. The use of several different further barrier layers results in a particularly stable structure, as each material of the further barrier layer and the barrier layer reacts differently to environmental influences.

According to another non-limiting embodiment, a further barrier layer includes silica that may be arranged between the quantum structure and a first barrier layer. The further barrier layer that includes silica leads may have improved chemical and mechanical stability for the structure.

Further, an agglomerate may include a plurality of the herein described structures. Hence, all features disclosed for the structure are also disclosed for the agglomerate and vice versa.

According to a non-limiting embodiment, the agglomerate may include a plurality of the afore-mentioned structures. The plurality of structures may be embedded in a protection layer that may include Al and/or Si and the material(s), which includes but is not limited to, X1, X2, O, or combinations thereof. In a non-limiting example, the protection layer may include aluminum oxide, silica, or a combination of X1, X2, Al, Si, O where X1 may be lithium. In addition or in the alternative, the protection layer may be a combination of silica, aluminum oxide, or a combination of Li, Al, Si, O, and combinations thereof.

The plurality of structures may be aggregated into larger structures and repolymerized with either silica or an alkali metal oxide to form the agglomerate having a higher order structure. More than one protection layer may be formed around the individual structures.

Further, a conversion element may include a plurality of the afore-mentioned structures. Hence, all features disclosed for the structure above apply for the structures included in the conversion element and vice versa.

According to another non-limiting embodiment, the conversion element may include a matrix material and a plurality of structures embedded in the matrix material. The matrix material may be or include, but is not limited to, a silicone, an epoxy, a silicate, a methacrylate, a polysiloxane, a polysilazane, or combinations thereof. The matrix material may be transparent for electromagnetic radiation.

The matrix material may be configured to protect the structures from degradation and/or to stabilize the structures against agglomeration. The plurality of structures may at least partially or completely be surrounded by the matrix material. In a non-limiting embodiment, the plurality of structures may be in direct contact with the matrix material. Furthermore, the matrix material may be configured to adhere the structures to an LED-chip.

The conversion element may at least partially convert electromagnetic primary radiation of a first wavelength range into electromagnetic secondary radiation of a second wavelength range. The conversion element may, in particular, be formed as a conversion layer or a conversion platelet that can be applied onto a transparent carrier or a radiation-emitting semiconductor element with or without an adhesive. In a non-limiting example, the structures may be used as a conversion material for converting the wavelength of a primary radiation that passes through at least part of the conversion material.

According to another non-limiting embodiment, the conversion element may include a matrix material and an agglomerate embedded in the matrix material. In a non-limiting example, the conversion element may include the matrix material and a plurality of agglomerates embedded in the matrix material. The agglomerate may be at least partially or completely surrounded by the matrix material. For example, the agglomerate may be in direct contact with the matrix material. The conversion element may include a plurality of the afore-mentioned agglomerates. Hence, all features disclosed for the agglomerate, above, would also be applicable when including the one or more agglomerates in the conversion element.

The conversion element may at least partially or fully convert electromagnetic primary radiation of a first wavelength range into electromagnetic secondary radiation of a second wavelength range. The conversion element may, in particular, be formed as a conversion layer or a conversion platelet which can be applied onto a transparent carrier or a radiation-emitting semiconductor element with or without an adhesive. In a non-limiting example, the structures in the agglomerate may be used as a conversion material for converting the wavelength of a primary radiation that passes through at least part of the conversion material.

Furthermore, a non-limiting embodiment of a method of producing the structure(s), e.g. a quantum structure(s), is disclosed. The quantum structure comprises a nanocrystalline core and a nanocrystalline shell, which differ in their material. The nanocrystalline core, for example, can be cadmium selenide, and the nanocrystalline shell, for example, can be cadmium sulfide. The quantum structure can be spherical, non-spherical, rod-shaped, elongated, dumbbell-shaped, or combinations thereof.

According to a non-limiting embodiment of the method, the quantum structure may be added to a first solvent to form a first solution. The first solvent may be or include, but is not limited to a non-polar solvent. Such non-polar solvents may be or include, but are not limited to, benzene, toluene, alkane, ether, or combinations thereof.

According to another non-limiting embodiment, the first solution may be added to a second solution. The addition of the first solution to the second solution may occur slowly by using a syringe. The second solution may be or include a non-polar solvent.

According to another non-limiting embodiment, the starting materials may be added to the second solution to obtain a structure. The starting materials may be or include, but are not limited to X1-, X2-, Al-, Si-, O-compounds, or combinations thereof. X1 and X2 may be or include, but are not limited to monovalent and/or divalent positively charged elements.

The starting materials can be, for example, metal salts that act as sol-gel starting materials. Furthermore, water may be present in the first solution and/or in the second solution where the water can be used as a reagent. The reaction temperature may range from 10° C. to 100° C., such as from 15° C. to 40° C.

In a non-limiting embodiment, a base or an acid, e.g. ammonium hydroxide, may be added to the second solution. The base or acid may be used for the hydrolysis of the starting materials to form a uniform barrier layer on the surface of the quantum structure. This approach may offer great flexibility to incorporate quantum structures of different sizes.

After the reaction finishes, the first and second solvents may be removed, and at the same time, the starting materials may be almost completely condensed and/or hydrolysed or completely condensed and hydrolyzed. Optionally, curing is performed. Due to the evaporation and the almost complete condensation/hydrolysis of the starting materials, a hard material may be formed during curing; such material may form the barrier layer.

The final structure may include the quantum structure and a barrier layer formed from the starting materials.

According to another non-limiting embodiment, the starting materials may be or include, but are not limited to, alkali metal salts, alkaline earth metal salts, aluminum salts, aluminate salts and esters, silicic acid and its esters, esters thereof, or combinations thereof. As alkali metal salts, alkali methoxide and/or alkali ethoxide can be used. Aluminum salts can be, for example, aluminum tri-ethoxide, aluminum tri-methoxide, aluminum tri-butoxide, or combinations thereof. Aluminate salts and esters can be, but are not limited to, sodium aluminate, calcium aluminate, aluminum oxyhydroxide, or combinations thereof. The silicic acid and its esters may be or include, but are not limited to, tetraethylorthosilicate, tetramethylorthosilicate, methyltriethoxysilane, ethyltrimethoxysilane, or combinations thereof. These starting materials have an improved reactivity and thus a fast coating of the quantum structure.

According to another non-limiting embodiment, the starting materials may be or include, but are not limited to, lithium methoxide, aluminum-tri-sec-butoxide, tetraethylorthosilicate, or combinations thereof. In addition to the starting materials, a base or an acid may be added to assist with hydrolyzing the tetraethylorthosilicate and to initiate the sol-gel reaction. Such bases and/or acids are known to those skilled in the art for initiating sol-gel reactions.

According to one non-limiting embodiment, the silicic acid may be hydrolyzed before the further starting materials are added. For example, the silicic acid ester may be added first to the second solution, and then the further starting materials and quantum structures are added. The silicic acid ester may be hydrolyzed in the second solution of the sol-gel reaction, and optionally without the presence of a catalyst. A base or an acid may be added to start the pre-hydrolysis.

The pre-hydrolysis may improve the reaction kinetics and has an influence on the final chemical composition of the barrier layer. The pre-hydrolysis of the silicic acid ester may lead to an amorphous phase-pure barrier layer in contrast to an inhomogeneous barrier layer where silica and aluminum oxide exist in spatially separate domains.

According to another non-limiting embodiment, the aluminum compound reacts at first with the hydrolyzed Si-compound before the further starting materials are added. This means that at first the Si-compound may be hydrolyzed and afterwards the aluminum compound may be added to the second solution and the aluminum compound reacts with the hydrolyzed Si-compound to form aluminosilicate. The formation of the aluminosilicate may take place in the presence or absence of quantum structures. The further starting materials, for example lithium salts and/or potassium salts, may be added and react with the aluminosilicate.

According to another non-limiting embodiment, the aluminum compound reacts first with the silicon compound before the further starting materials are added. The silicon compound reacts first with the aluminum compound and then with the further starting materials, for example lithium salts or potassium salts, when added. The quantum structure may or may not be present in the second solution.

According to another non-limiting embodiment, the method may include a reverse micelle sol-gel reaction or an atomic layer deposition. For example, the barrier layer (e.g. aluminum oxide barrier layer) is formed by an atomic layer deposition. Alternatively, the barrier layer, (e.g. Al and at least one material selected from the elements X1, X2, Si, O, or combinations thereof) may be formed by the reverse micelle sol-gel reaction.

According to another non-limiting embodiment, adding the first solution to the second solution may include adding a compound to the second solution. The compound may be or include, but is not limited to, 3-aminopropyltrimethoxysilane (APTMS), 3-mercapto-trimethoxysilane, a silane comprising a phosphonic acid or a carboxylic acid functional group, or combinations thereof. The first solution may be added along with a 3-aminopropyltrimethoxysilane (APTMS), 3-mercapto-trimethoxysilane, a silane comprising a phosphonic acid, a carboxylic acid functional group, or combinations thereof, to the second solution. Further compounds can be added to the second solution or first solution.

According to another non-limiting embodiment, the first solution and/or the second solution may include a surfactant, such as but not limited to, SDS, CTAB, Igepal, Tergitol, Triton X, or combinations thereof. In a non-limiting example, the surfactant may be dissolved in the second solution.

According to another non-limiting embodiment, the thickness of the barrier layer may depend on the amount of starting material added to the second solution.

For example, an amount of the starting material may be increased at the beginning of the reaction, and then an additional amount of the starting material may be added (e.g. injected) one or more additional times throughout the reaction. A syringe pump may be used to increase the overall amount of starting material but the dispensing may be performed slowly during the reaction time.

Upon initiation of growth of the barrier layer, the final size or thickness of the barrier layer may be controlled by the amount of starting material and the method used to add the starting material(s).

The thickness of the barrier layer may range from about 25 nm to about 35 nm, for example about 30 nanometres in a non-limiting embodiment.

An advantage of the thus produced and herein described structure is a high chemical and mechanical stability of quantum structures, which are protected from water vapor, oxygen, air, and other environmental effects in order to extend the lifetime of the quantum structures and devices. Furthermore, the barrier layer around the quantum structure leads to a high photoluminescent quantum yield with stable light emission.

In addition, coating of quantum structures with the here described barrier layer may provide a generally more versatile route to stabilize a wide range of quantum structures compared to common barrier layers. The chemical composition of the structure can be tuned in a way that a common structure, such as one based on an $SiO_2$-coated quantum structure, could not be. This allows for better strain engineering and corrosion control. This permits control over water transport through the barrier layer and also the local dielectric properties of the material.

BRIEF DESCRIPTION OF THE DRAWINGS

Further non-limiting embodiments and developments of the structure(s), the agglomerate(s), the conversion element, the method of producing the structure, or combinations thereof will become apparent from the embodiments described below in connection with the figures.

In the above-mentioned non-limiting embodiments and figures, identical or identically acting elements can each be provided with the same reference. The illustrated elements and their proportions among each other are not to be regarded as true to scale, but individual elements such as layers, components, and areas may be oversized for better representability and/or better understanding.

DETAILED DESCRIPTION

Figure 1:
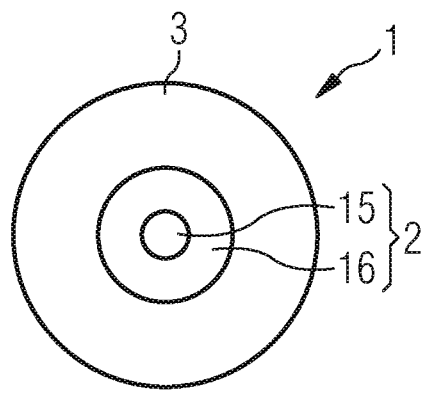
FIGS. 1-4 show a schematic sectional view of a structure according to a non-limiting embodiment.

FIG. 1 shows a structure 1 that may include a quantum structure 2 and a barrier layer 3 according to a non-limiting embodiment.

The barrier layer 3 may coat the quantum structure 2. The barrier layer 3 may include Al and at least one material, such as but not limited to, X1, X2, Si, O, or combinations thereof. X1 and X2 may be or include monovalent and/or divalent positively charged elements. The barrier layer 3 at least partially or fully surrounds the quantum structure 2. The barrier layer 3 may include a dense material so that the protection of the quantum structure is improved. Further, the barrier layer 3 may be transparent for electromagnetic radiation.

The quantum structure 2 may include a nanocrystalline core 15 and a nanocrystalline shell 16 of an II-VI compound semiconductor material in a non-limiting example.

In this embodiment, the nanocrystalline core 15 comprises or consists of cadmium selenide. The nanocrystalline shell 16 of the quantum structure 2 comprises or consists of cadmium sulfide. The barrier layer 3 contacts, i.e. directly, with the nanocrystalline shell 16 of the quantum structure 2.

The barrier layer 3 may include a ratio of Al:Si ranging from 1:1 to 1:4, and the ratio of X1: Si and/or X2:Si in the barrier layer 3 may range from 1:1 to 1:17. The thickness of the barrier layer 3 is between 10 nanometers and 1000 nanometers.

In another non-limiting embodiment, X1 may be lithium and X2 may be potassium. Thus, the material of the barrier layer 3 may be or include Li, K, Al, Si, O, or combinations thereof.

In another non-limiting embodiment, the material of the barrier layer 3 may be or include, but is not limited to, lithium, aluminum, silicon, oxygen, or combinations thereof.

Moreover, according to another non-limiting embodiment, the barrier layer 3 consists of aluminum oxide.

The material to be used for the barrier layer 3 depends, among other things, on the size of the quantum structures and application of the structure 1.

It is also possible that a first barrier layer 3 may be or include, but is not limited to, aluminum oxide and one or more further barrier layers 3 is a combination of Li, K, Al, Si, O, or combinations thereof. If more than one barrier layer 3 is formed, the barrier layers 3 can differ in chemical composition. Moreover, the different barrier layers 3 may not be chemically connected to each other, and/or between the different barrier layers 3, there may be grain boundaries. Thus, a quantum structure 2 with a plurality of barrier layers 3 can be formed where the plurality of barrier layers 3 are not connected to each other via a covalent bond. For example the quantum structure 2 forms a quantum dot.

Figure 2:
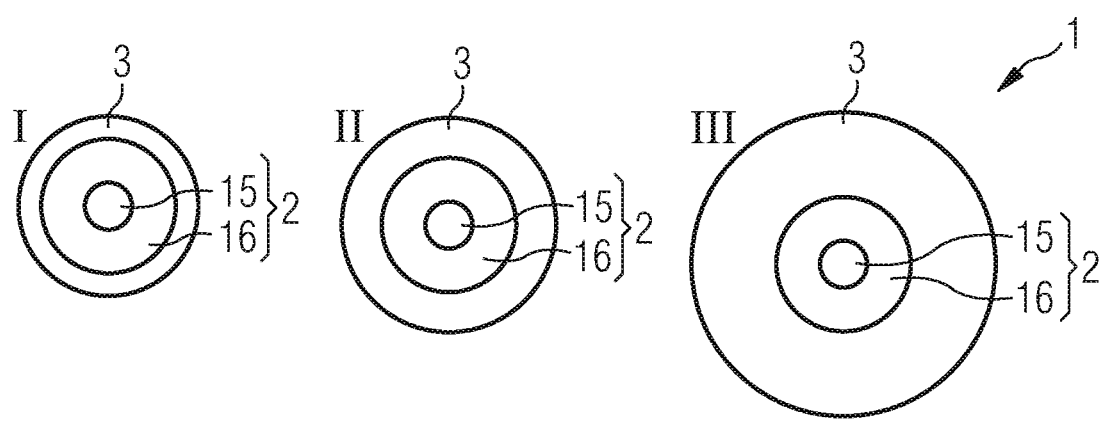

In FIG. 2, a schematic sectional view of an exemplary embodiment of the structure 1 is shown. FIG. 2 shows three versions of structures 1, i.e. I, II, III, which differ in the thickness of their barrier layers 3. The diameter of the quantum structure 2 may be similar in all three versions of structures 1. Different thicknesses of the barrier layer 3 can be obtained by adding different amounts of starting material 12, as mentioned above.

Figure 3:
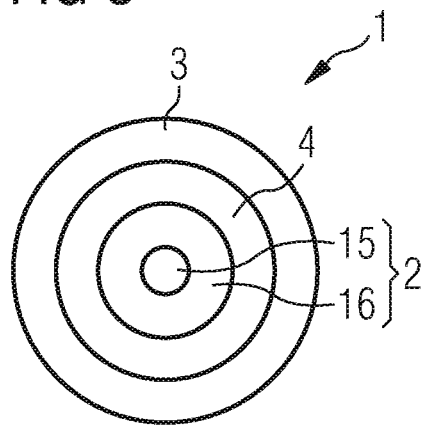

FIG. 3 is a schematic sectional view of a structure 1 having a quantum structure 2, a further barrier layer 4, and a barrier layer 3 surrounding the further barrier 4 according to a non-limiting embodiment. The further barrier layer 4 is in direct contact with the nanocrystalline shell 16 of the quantum structure 2. The further barrier layer 4 may be or include at least one material, such as but not limited to, alkali and alkaline earth metal cations, silica, titanium oxide, zirconia, aluminum oxide, or hafnia. More than one further barrier layer 4 can be formed.

In a non-limiting embodiment, the further barrier layer 4 may be or include $SiO_2$, and the barrier layer 3 may be or include $Al_2O_3$.

In another non-limiting embodiment, the further barrier layer 4 may be or include, but is not limited to, $SiO_2$. The barrier layer 3 may be or include a composition of a material, such as but not limited to, Li, K, Si, Al, O, or combinations thereof.

Figure 4:
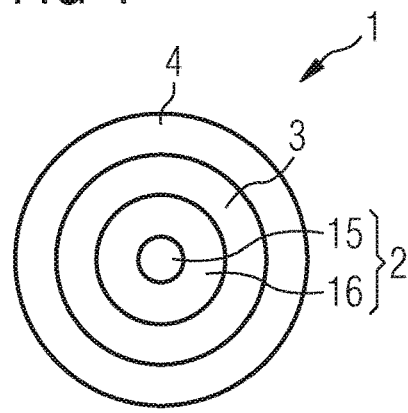

In FIG. 4, the further barrier layer 4 is in direct contact with the barrier layer 3, and the barrier layer 3 is in direct contact with the quantum structure 2.

In a non-limiting embodiment, the barrier layer 3 may be or include a composition of a material, such as but not limited to, Li, K, Si, Al, O, or combinations thereof. The further barrier layer 4 may be or include $TiO_x$.

Figure 5:
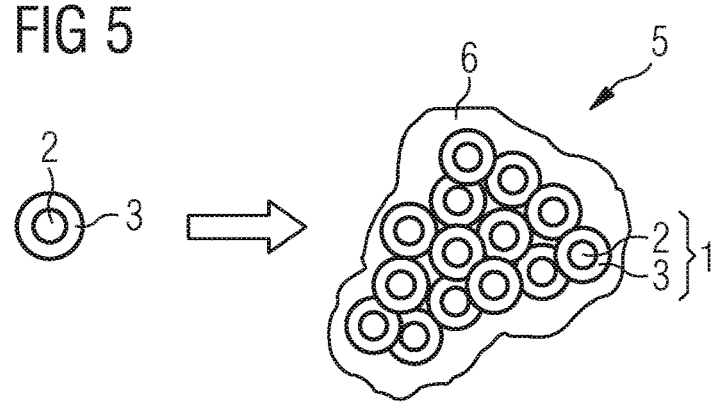
FIG. 5 shows a schematic sectional view of an agglomerate according to a non-limiting embodiment.

FIG. 5 shows a schematic sectional view of an agglomerate 5 with a plurality of structures 1 according to a non-limiting embodiment. The agglomerate 5 may include a plurality of structures 1 embedded in a protection layer 6. The protection layer 6 may be or include Al and/or Si and at least one material, such as but not limited to X1, X2, O, or combinations thereof. X1 and X2 may be or include, but are not limited to monovalent or divalent positively charged elements. The protection layer 6 may additionally protect the structures 1.

In a non-limiting embodiment, the protection layer may be or include a composition of a material, such as but not limited to Li, K, Si, Al, O, or combinations thereof.

Figure 6:
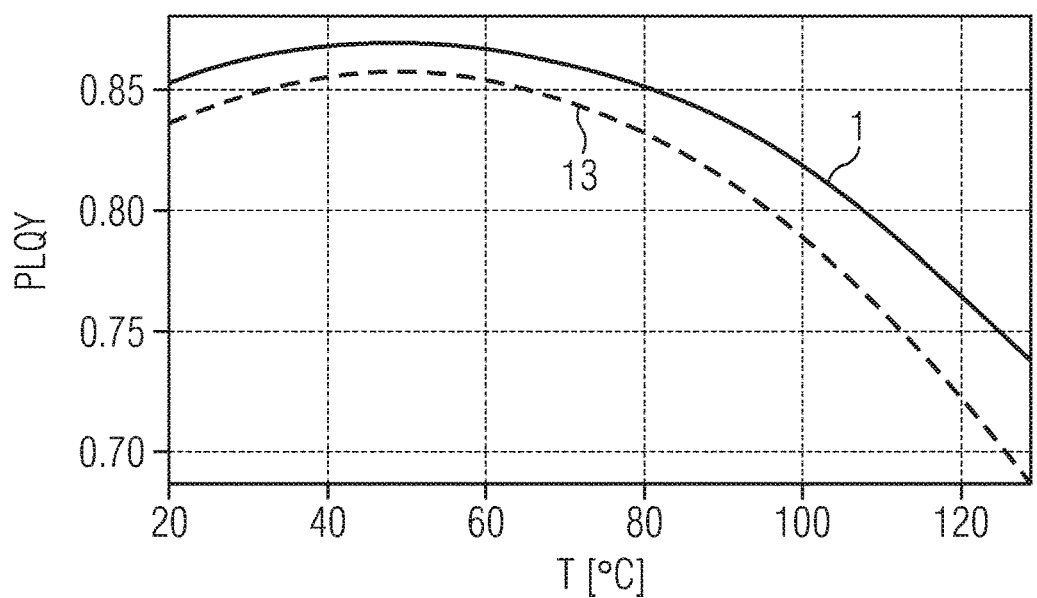
FIG. 6 shows a graphical view of PLQY depending on the temperature of the structure and a common structure.

FIG. 6 shows a graph where the photoluminescent quantum yield (PLQY) is plotted against the temperature T [° C.] according to a non-limiting embodiment. FIG. 6 shows that the structure 1 has a higher PLQY than a common structure 13. The common structure 13 can be an $SiO_2$-coated quantum structure. When increasing the temperature to up to 120° C., the PLQY of the common structure 13 drops faster than the PLQY of the structure 1.

Figure 7:
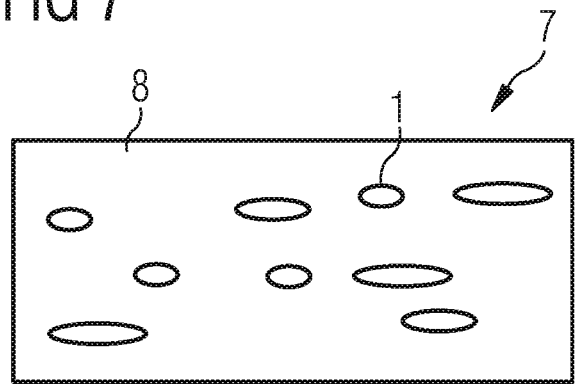
FIGS. 7-8 show a schematic sectional view of a conversion element according to a non-limiting embodiment.

FIG. 7 shows a conversion element 7 that may include a matrix material 8 and a plurality of structures 1 embedded in the matrix material 8 according to a non-limiting embodiment. The matrix material 8 may be or include a silicone, such as but not limited to epoxy, a silicate, a methacrylate, a polysiloxane, polysilazane, or combinations thereof. The matrix material 8 may be transparent for electromagnetic radiation. The structure 1 may be completely covered by the matrix material 8.

Figure 8:
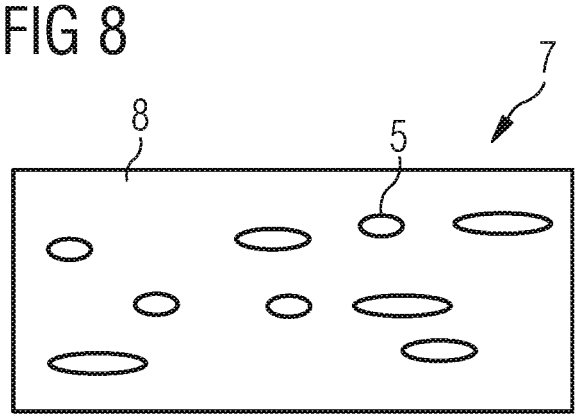

FIG. 8 shows, according to a non-limiting embodiment, a conversion element 7 having a matrix material 8 and a plurality of agglomerates 5 embedded in the matrix material 8. Alternatively, only one agglomerate 5 is embedded in the matrix material 8. The matrix material 8 may be a silicone that completely covers the plurality of agglomerates 5.

Figure 9:
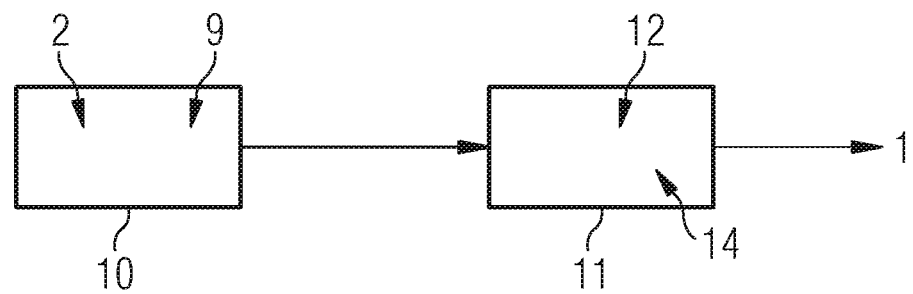
FIG. 9 shows a method of producing a structure according to a non-limiting embodiment.

In FIG. 9, a non-limiting embodiment of a method of producing a structure 1 is shown. The method may include adding a quantum structure 2 to a first solvent 9 to form a first solution 10. The first solvent 9 may be or include a non-polar solvent. A second solution 11 may be prepared that may include an optional surfactant dissolved in a second non-polar solvent 14. The first solution 10 may be added to the second solution, along with a species such as, but not limited to, 3-aminopropyltrimethoxysilane (APTMS), 3-mercapto-trimethoxysilane, a silane comprising a phosphonic acid or a carboxylic acid functional group, or combinations thereof.

In the first solvent, or in the second solvent 9, 14, water may be present as a reagent and/or as a solvent.

Afterwards, the starting materials 12 may be added to the second solution 11 to obtain a structure 1. The reaction temperature may range from 10° C. to 100° C. Starting materials 12 may be or include, but are not limited to X1, X2, Al, Si, O compounds, or combinations thereof. X1 and X2 may be or include monovalent and/or divalent positively charged elements. The starting materials 12 can be lithium methoxide, aluminum-tri-sec-butoxide, tetraethylorthosilicate, or combinations thereof which are added in combination with a base, e.g. ammonium hydroxide, to the second solution 11. The order in which the starting materials 12 are added can be varied. For example, at first a silicon compound may be added to the second solution 11.

Then, the aluminum compound and then the further starting materials 12 may be added. This way, the Si-compound is pre-hydrolyzed, and then the Al-compound reacts with the pre-hydrolyzed Si-compound to form an aluminosilicate. The aluminosilicate then reacts with any further added starting materials 12.

Furthermore, the thickness of the barrier layer 3 can be controlled. The amount of the starting material 12 is increased at the beginning of the formation of the barrier layer 3, and additional starting materials 12 may be injected one or more additional times throughout the reaction. For example, a syringe pump is used to increase the overall amount of starting materials 12 but dispensing is performed slowly during the reaction time. Upon initiation of growth of the barrier layer 3, the final size or thickness of the barrier layer 3 can be controlled by the amount of the starting materials 12 and the injection method used. When growing layers thicker than approximately 30 nanometers, it may be critical to control the amount and rate of starting materials 12 entering into the reaction mixture to avoid forming free starting material 12 particles.

The features and non-limiting embodiments described in connection with the figures can be combined with each other according to further embodiments, even if not all combinations are explicitly described. Furthermore, the embodiments described in connection with the figures may alternatively or additionally comprise further features as described in the general part.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

What is claimed is:

1. A structure comprising:
a quantum structure;
a barrier layer coating the quantum structure; wherein the barrier layer comprises a composition formed from:
a first starting material comprising an aluminum containing compound selected from the group consisting of aluminosilicates, aluminum salts, aluminate salts, or aluminum esters; and
a second starting material comprising alkali metal salts and;
one or more further barrier layers; wherein the one or more further barrier layers coat the quantum structure.

2. The structure according to claim 1, wherein the alkali metal is lithium, sodium, potassium, or combinations thereof.

3. The structure according to claim 2, wherein the alkali metal containing compound comprises lithium.

4. The structure according to claim 1, wherein the one or more further barrier layers comprise a material selected from the group consisting of silica, titanium oxide, zirconia, aluminum oxide, hafnia, alkali metal salts, alkali metal cations, and combinations thereof.

5. The structure according to claim 1, further comprising one or more further barrier layers between the quantum structure and the barrier layer; wherein the one or more further barrier layers comprise silica.

6. An agglomerate with a plurality of the structures according to claim 1, wherein the agglomerate comprises:
the plurality of structures embedded in a protection layer; and wherein the protection layer comprises Al and/or Si; and wherein the protection layer further comprises a material selected from the group consisting of X1, X2, O, or combinations thereof; wherein X1 and X2 are selected from monovalent positively charged elements and/or divalent positively charged elements.

7. A conversion element comprising:
a matrix material; and
a plurality of structures embedded in the matrix material; wherein each structure of the plurality of structures comprises:
a quantum structure; and
a barrier layer coating the quantum structure; wherein the barrier layer comprises a composition formed from:
a first starting material comprising an aluminum containing compound selected from the group consisting of aluminosilicates, aluminum salts, aluminate salts, or aluminum esters; and
a second starting material comprising alkali metal salts.

8. A conversion element comprising:
a matrix material; and
an agglomerate embedded in the matrix material; wherein the agglomerate comprises a plurality of structures; wherein each structure of the plurality of structures comprises:
a quantum structure; and
a barrier layer coating the quantum structure; wherein the barrier layer comprises a composition formed from:
a first starting material comprising an aluminum containing compound selected from the group consisting of aluminosilicates, aluminum salts, aluminate salts, or aluminum esters; and
a second starting material comprising alkali metal salts;
wherein the plurality of structures are embedded in a protection layer; and wherein the protection layer comprises Al and/or Si; and wherein the protection layer further comprises a material selected from the group consisting of X1, X2, O, or combinations thereof; wherein X1 and X2 are selected from monovalent positively charged elements and/or divalent positively charged elements.

* * * * *